(12) United States Patent
Park

(10) Patent No.: US 8,227,803 B2
(45) Date of Patent: Jul. 24, 2012

(54) ORGANIC ELECTROLUMINESCENT DISPLAY DEVICE AND METHOD FOR FABRICATING THE SAME

(75) Inventor: Dong-Sik Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 38 days.

(21) Appl. No.: 12/887,992

(22) Filed: Sep. 22, 2010

(65) Prior Publication Data

US 2011/0140113 A1 Jun. 16, 2011

(30) Foreign Application Priority Data

Dec. 14, 2009 (KR) ........................ 10-2009-0123982

(51) Int. Cl.
*H01L 35/24* (2006.01)
*H01L 51/00* (2006.01)
(52) U.S. Cl. ..................... 257/40; 257/59; 257/E39.007; 257/E29.117
(58) Field of Classification Search .................... 257/40, 257/59, 72, E39.007, E29.117, E29.273
See application file for complete search history.

(56) References Cited

U.S. PATENT DOCUMENTS 7,710,364 B2 * 5/2010 Ozawa et al. .................. 345/76

* cited by examiner

*Primary Examiner* — Hoai V Pham
(74) *Attorney, Agent, or Firm* — Morgan, Lewis & Bockius LLP

(57) ABSTRACT

An organic electroluminescent display device includes at least one switching transistor and driving transistor formed on an array substrate, wherein the array substrate includes a gate pad and a date pad formed thereon; a contact electrode, a gate pad top electrode of the gate pad and a data pad top electrode of the data pad formed on a passivation layer, a contact electrode, a top gate pad electrode and a top data pad electrode electrically connected to the exposed portion of a drain electrode of the driving transistor, a gate pad bottom electrode and a data pad bottom electrode respectively; a light-emitting cell including a cathode electrode, an anode electrode and an organic layer interposed therebetween formed on the planarization layer; wherein the cathode electrode is electrically connected to the contact electrode via one of the contact hole; wherein the contact electrode has acid-resistance with respect to an etchant used in patterning the cathode electrode.

4 Claims, 10 Drawing Sheets

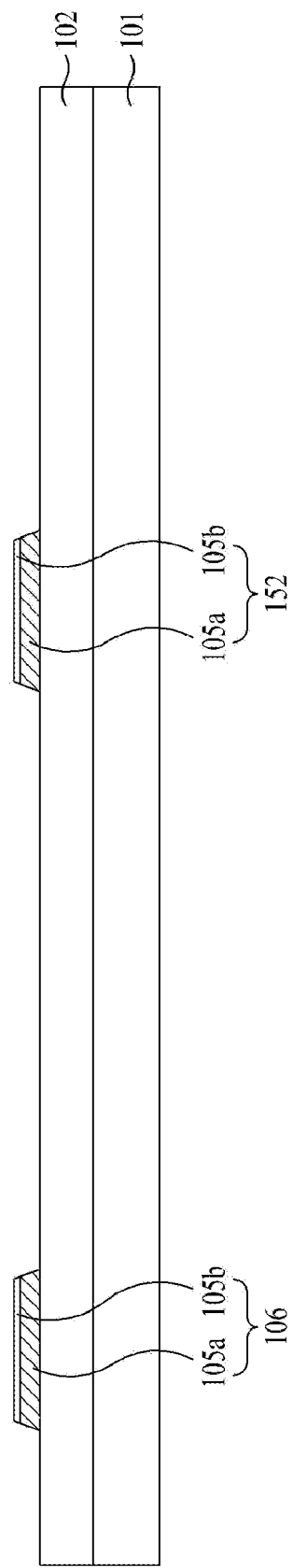

ORGANIC ELECTROLUMINESCENT DISPLAY DEVICE AND METHOD FOR FABRICATING THE SAME

CROSS REFERENCE TO RELATED APPLICATION

This application claims the benefit of the Patent Korean Application No. 10-2009-0123982, filed on Dec. 14, 2009, which is hereby incorporated by reference as if fully set forth herein.

BACKGROUND OF THE DISCLOSURE

1. Field of the Disclosure

The present invention relates to an organic electroluminescent display device that is able to prevent deterioration of an aperture ratio and a method for fabricating the same.

2. Discussion of the Related Art

In recent, diverse flat panel displays capable of reducing the weight and volume have been under development, which are disadvantages thereof. Such a flat panel display may include a liquid crystal display, filed emission display, plasma display panel and electro-luminescence display.

Out of them, the field emission display is a self-luminescent display having no backlight and it may be a light thin type with excellent characteristics (e.g. a simple fabrication process, wide view angle and fast response and high contrast ratio). Because of that, the field emission display is suitable to a next generation flat panel display.

Especially, the field emission display includes a hole of an anode electrode and an electrode of a cathode electrode which are coupled to each other in an organic luminescent layer to form an exciton having a couple of a hole and an electron and it is luminescent by an energy generated when the exiton returns to a bottom status.

This field emission display is configured of a light-emitting cell which is a luminescence diode generating a light and a plurality of transistors driving the light-emitting cell.

In the meanwhile, a conventional bottom emission type display emitting a light generated from a light-emitting cell toward a substrate has a disadvantage of a deteriorated aperture ratio caused by a cell driving part formed on the same substrate together with the light-emitting cell.

SUMMARY OF THE DISCLOSURE

Accordingly, the present invention is directed to an organic electroluminescent display device and a fabricating method of the same.

An object of the present invention is to provide an organic electroluminescent display device that is able to prevent deterioration of an aperture ratio and a fabricating method of the same Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic electroluminescent display device includes at least one switching transistor and driving transistor formed on a array substrate, wherein the array substrate includes a gate pad and a date pad formed thereon; a passivation layer having a plurality of a first contact holes to expose a portion of a drain electrode of the driving transistor, a gate pad bottom electrode of the gate pad and a date pad bottom electrode of the data pad respectively; a contact electrode, a gate pad top electrode of the gate pad and a data pad top electrode of the data pad formed on the passivation layer, the contact electrode, a top gate pad electrode and a top data pad electrode electrically connected to the exposed portion of the drain electrode of the driving transistor, the gate pad bottom electrode and the date pad bottom electrode respectively, a planarization layer formed on the passivation layer, the planarization layer including a plurality of a second contact holes to expose a portion of the contact electrode, the gate pad top electrode and the data pad top electrode respectively; a light-emitting cell including a cathode electrode, an anode electrode and an organic layer interposed therebetween formed on the planarization layer; wherein the cathode electrode is electrically connected to the contact electrode via one of the contact hole; wherein the contact electrode has acid-resistance with respect to an etchant used in patterning the cathode electrode.

The cathode electrode may have a single layer structure formed of Aluminum-Neodymium and the top of at least one of the gate pad and data pad may have a single layer structure formed of Molybdenum-Titanium.

The gate pad may include the gate pad bottom electrode connected with a gate line; and the gate pad top electrode having the single layer structure formed of Molybdenum-Titanium, and the data pad may includes the data pad bottom electrode connected with a data line; and the data pad top electrode having the single layer structure formed of Molybdenum-Titanium.

The contact electrode may be formed of a same metal and on a same layer to the gate pad top electrode and the data pad top electrode.

In another aspect of the present invention, a method for fabricating an organic luminescent display device includes steps of: forming a switch thin film transistor, a driving thin film transistor, a gate pad bottom electrode connected with a gate line and a data pad bottom electrode connected with a data line on a substrate; forming a passivation layer having a plurality of a first contact holes to expose a portion of a drain electrode of the driving transistor, the gate pad bottom electrode and the date pad bottom electrode respectively; forming a contact electrode, a gate pad top electrode and a data pad top electrode formed on the passivation layer, the contact electrode, a top gate pad electrode and a top data pad electrode electrically connected to the exposed portion of the drain electrode of the driving transistor, the gate pad bottom electrode and the date pad bottom electrode respectively, forming a planarization layer formed on the passivation layer, the planarization layer including a plurality of a second contact holes to expose a portion of the contact electrode, the gate pad top electrode and the data pad top electrode respectively; forming a light-emitting cell including a cathode electrode, an anode electrode and an organic layer interposed therebetween formed on the planarization layer; wherein the cathode electrode is electrically connected to the contact electrode via one of the contact hole; wherein the contact electrode has acid-resistance with respect to an etchant used in patterning the cathode electrode.

The cathode electrode may be have a single layer structure formed of Aluminum-Neodymium and the gate pad top electrode and the data pad top electrode have a single layer structure formed of Molybdenum-Titanium.

The contact electrode may be formed of a same metal and on a same layer to the data pad top electrode and the gate pad top electrode.

According to the present invention, the gate pad top electrode, data pad top electrode and contact electrode are formed of a single layer structure using a contact metal layer having good electric conductive such as Molybdenum-Titanium and the like, As a result, contact resistance may be reduced enough to prevent deterioration of image quality, for example, Mura and the like. Moreover, if the gate pad top electrode data pad, top electrode and contact electrode are formed of the single layer structure using the contact metal layer such as Molybdenum-Titanium and the like, a single deposition process and a single etching process are necessary and the number of the processes is reduced only to reduce the production cost. Also, if the gate pad top electrode, data pad top electrode and contact electrode are formed of Molybdenum-Titanium, Molybdenum-Titanium is Acid-resistant with respect to the etching liquid used in the patterning of the cathode electrode and the etching liquid of the cathode electrode may be prevented from corroding when the gate pad top electrode, data pad top electrode and contact electrode form the cathode electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure.

In the drawings:

FIGS. 3A to 3H are sectional views to describe a method for fabricating the driving thin film transistor and the light-emitting cell shown in FIG. 2, respectively.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

As follows, an exemplary embodiment of the present invention will be described in detail.

Figure 1:
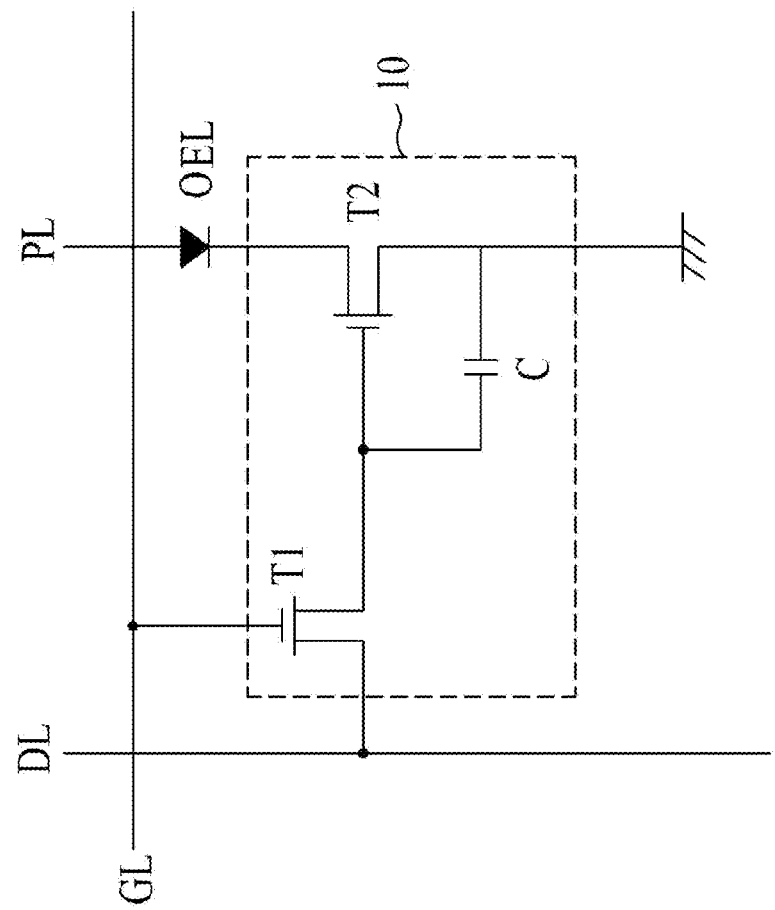
FIG. 1 is a circuit diagram illustrating a luminescent display according to an exemplary embodiment of the present invention.

FIG. 1 is a circuit diagram illustrating an organic field emission display according to the exemplary embodiment of the present invention.

The organic field emission display shown in FIG. 1 includes a gate line GL for transporting a scan signal, a data line DL for transporting a data signal, a power line PL for transporting a power signal, a cell driving part 10 connected to the gate line GL, data line DL and power line PL and a light-emitting cell OEL connected with the cell driving part 10 and power line PL.

The gate line GL is connected to a gate pad and it supplies the scan signal to a switch thin film transistor T1. The data line DL is connected to a data pad and it supplies the data signal to the switch thin film transistor T1. The power line PL supplies the power signal to a driving thin film transistor T2.

The cell driving part includes the switch transistor T1 connected to the gate line GL and data line DL, the driving transistor T2 connected with the switch transistor T1, a cathode electrode of the light-emitting cell and a base voltage source, and a storage capacitor C connected between drain electrodes of the base voltage source and the switch transistor T1.

Once a scan pulse is supplied to the gate line GL, the switch thin film transistor T1 is turned on to supply the data signal supplied from the data line DL to the storage capacitor C and a gate electrode 106 of the driving thin film transistor T2.

In response to the data signal supplied to the gate electrode, the driving thin film transistor T2 controls a current supplied to the light-emitting cell OEL from the power line PL to adjust the light amount of the light-emitting cell OEL.

Figure 2:
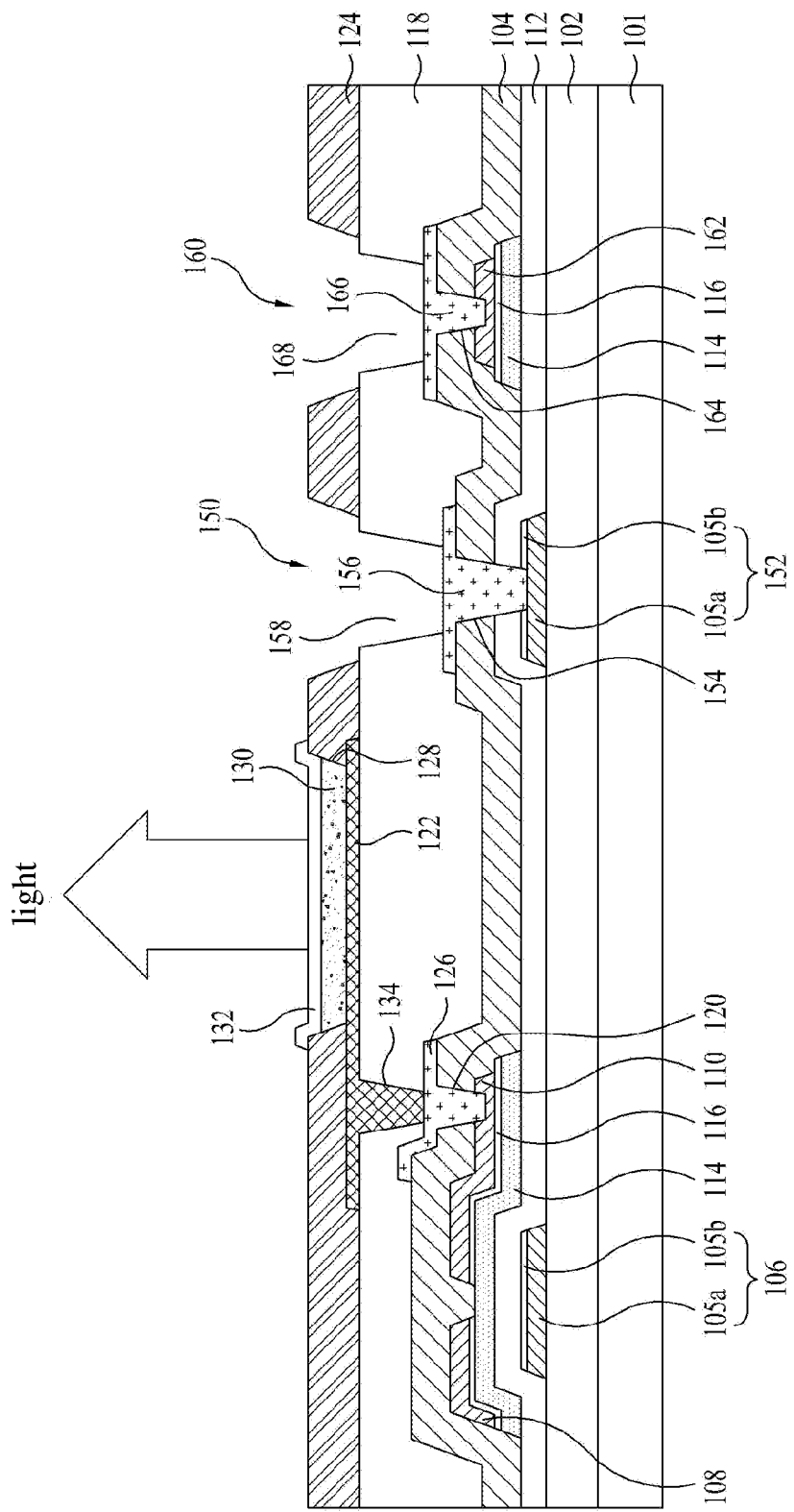
FIG. 2 is a sectional view illustrating a driving thin film transistor and a light-emitting cell shown in FIG. 1.

For that, as shown in FIG. 2, the driving thin film transistor T2 includes a gate electrode 106 electrically connected with the switch thin film transistor T1, a drain electrode 110 connected with a cathode electrode 122 of the light-emitting cell OEL, a source electrode 108 facing to the drain electrode 110 in opposite, an active layer 114 overlapped with the gate electrode 106 with a gate dielectric layer 112 located there between to form a channel between the source electrode 108 and drain electrode 110, and an ohmic contact layer formed between the active layer 114 and the source and drain electrodes 108 and 110, except the channel, for ohmic contact with the source and drain electrodes 108 and 110. The active layer 114 and the ohmic contact layer 116 are overlapped with a data pad bottom electrode 164.

The light-emitting cell OEL includes a cathode electrode 122 made of opaque material formed on a planarization layer 118, an organic layer 130 a light-emitting layer formed on a bank dielectric layer 123 and the cathode electrode 122 exposed via a pixel hole 128 passing the bank dielectric layer 124, and an anode electrode 132 formed on the organic layer 130. The organic layer 130 is configured of a hole injection layer, a hole transportation layer, a light-emitting layer, an electron transportation layer and an electron injection layer which are multi-layered on the cathode electrode 122 and the bank dielectric layer 124. The cathode electrode 122 is electrically connected with the drain electrode 110 of the driving thin film transistor T2 via a contact electrode 126. The anode electrode 132 is formed on the organic layer 130 and the cathode electrode 122 is formed under the organic layer 130 to be used as reflective electrode. As a result, the light generated from the organic layer 130 is emitted upward via the anode electrode 132 such that the deterioration of the aperture ratio caused by the switch transistor T1 and the driving transistor T2 may be prevented.

The gate pad 150 is connected with a gate driving integrated circuit (not shown) to supply the scan signal to the gate line GL. For that, the gate pad 150 includes a gate pad bottom electrode 152 extended from the gate line GL and a gate pad top electrode 156 connected on the gate pad bottom electrode 152. Here, the gate pad top electrode 156 is connected with the gate pad bottom electrode 152 via a first gate contact hole 156 passing through the gate dielectric film 112 and a protection film 104. The gate pad top electrode 156 is exposed outside via a second gate contact hole 158 passing through the planarization layer 118 to be connected with a transportation film having the gate driving integrated circuit mounted therein.

The data pad 160 is connected with a data driving integrated circuit (not shown) to supply the data signal to the data line DL. For that, the data pad 160 includes a data pad bottom electrode 162 extended from the data line DL and a data pad top electrode 166 connected on the data pad bottom electrode 162. Here, the data pad top electrode 166 is connected with the data pad bottom electrode 162 via a first data contact hole 164 passing through the protection film 104. The data pad top electrode 166 is exposed outside via a second data contact hole 168 passing through the planarization layer 118 to be connected with a transportation film having the data driving integrated circuit mounted therein.

Such the gate pad top electrode 156, data pad top electrode 166 and contact electrode 126 are formed simultaneously as contact metal layer in a patterning process which uses an identical mask. Here, the contact metal layer is formed of Molybdenum-titanium (MoTi) or Molybdenum-tantalum (MoTa) having excellent corrosion-resistance and low specific resistance to prevent the gate pad top electrode 156 and data pad top electrode 166 exposed to external air from corroding.

According to the present invention, the gate pad top electrode 156 and data pad top electrode 166 and contact electrode 126 are formed of a single layer structure using the contact metal layer having good electric conductive such as Molybdenum-Titanium and the like, not a multi-layer structure using a transparent conductive film such as Molybdenum, ITO and the like. As a result, contact resistance may be reduced enough to prevent deterioration of image quality, for example, Mura and the like.

Moreover, if the gate pad top electrode 156, data pad top electrode 166 and contact electrode 126 are formed of the multi-layer structure, a plurality of deposition processes and a plurality of etching processes are necessary. In contrast, if they are formed of the single layer structure using the contact metal layer such as Molybdenum-Titanium and the like, a single deposition process and a single etching process are necessary and the number of the processes is reduced only to reduce the production cost.

Also, if the gate pad top electrode 156, data pad top electrode 166 and contact electrode 126 are formed of the multi-layer structure using the transparent conductive film such as Molybdenum, ITO and the like, etching liquid used in patterning of the cathode electrode 122 connected with the contact electrode 126 would penetrate through grain of the transparent conductive film only to damage the transparent conductive film. If external moisture penetrate through the damaged transparent conductive film, the gate pad top electrode 156, data pad top electrode 166 and contact electrode 126 will corrode.

In contrast, if the gate pad top electrode 156, data pad top electrode 166 and contact electrode 126 are formed of Molybdenum-Titanium, Molybdenum-Titanium is Acid-resistant with respect to the etching liquid used in the patterning of the cathode electrode 122 and the etching liquid of the cathode electrode 122 may be prevented from corroding when the gate pad top electrode 156, data pad top electrode 166 and contact electrode 126 form the cathode electrode 122.

FIGS. 3A to 3H are sectional diagrams to describe a fabricating method of the GELD shown in FIG. 2.

In reference to FIG. 3A, on a substrate 101 formed a buffer layer 102, and a first conductive pattern group including a gate electrode 106 and a gate pad bottom electrode 152.

Specifically, the buffer layer 102 is formed in a deposition method, for example, PECVD or coating method, for example, spin coating and first and second gate metal layers 105a and 105b are sequentially formed in a deposition method, for example, sputtering. Here, the buffer layer 102 is formed of inorganic dielectric material such as silicon oxide (SiOx) and silicon nitride (SiNx) or organic dielectric material such as polyimide (PI). One of the first and second gate metal layers 105a and 105b is formed of metal having relatively good rigidity or corrosion-resistance such as Titanium (Ti), Molybdenum (Mo) and Tungsten (W) and the other one is formed of metal such as Aluminum containing metal (Al and AlNd) and copper (Cu). Hence, the first and second metal layers 105a and 105b are patterned by using a first mask in a photolithography process and an etching process such that the first conductive pattern group including the gate electrode 106 and gate pad bottom electrode 152 may be formed.

Figure 3B:
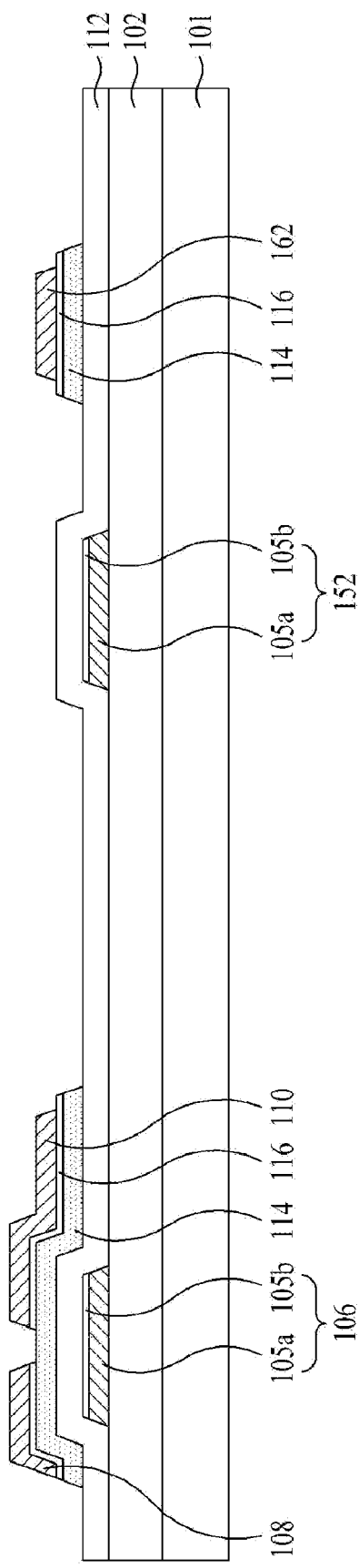

In reference to FIG. 3B, the gate dielectric film 112 is formed on the substrate 101 having the first conductive pattern group formed thereon. On the gate dielectric film 112 are formed a second conductive group including the source electrode 108, drain electrode 110 and data pad bottom electrode 162 and a semiconductor pattern including the active layer 114 and ohmic layer 116 overlapped under the second conductive group. Such the semiconductor pattern 115 and the second conductive pattern group are formed in a single mask process using slit mask or half tone.

Specifically, the gate dielectric film 112, an amorphous silicon layer, an amorphous silicon layer having impurity (n+ or p+) doped thereon and data metal layer are sequentially formed on the substrate 101 having the gate metal pattern formed thereon. Here, inorganic dielectric material such as silicon oxide (SiOx) and silicon nitride (SiNx) is used as the gate dielectric film 112 and metal such as Titanium (Ti), Tungsten (W), Aluminum (Al) containing metal, Molybdenum (Mo) and copper (Cu) is used as data metal layer.

After photoresist is coated on the data metal layer, the photolithography process using the slit mask as second mask exposes and develops the photoresist to form a photoresist pattern having a step.

The etching process using the photoresist pattern having the step patterns the data metal layer to form the second conductive pattern and the semiconductor pattern formed under the second conductive pattern.

Hence, an asking process using Oxygen ($O_2$) plasma ashes the photoresist pattern. The etching process using the asked photoresist removes the exposed data metal pattern and the ohmic contact layer 116 formed under the data metal pattern such that the source electrode 108 and drain electrode 110 may be separated and that the active layer 114 may be exposed. After that, a strip process removes the photoresist pattern remaining on the second conductive pattern group.

This embodiment presents that the semiconductor pattern 114 and 116 and the second conductive pattern group are formed by the single mask process using the slit mask or half Tone and they may be formed by independent mask processes using independent masks, respectively.

Figure 3C:
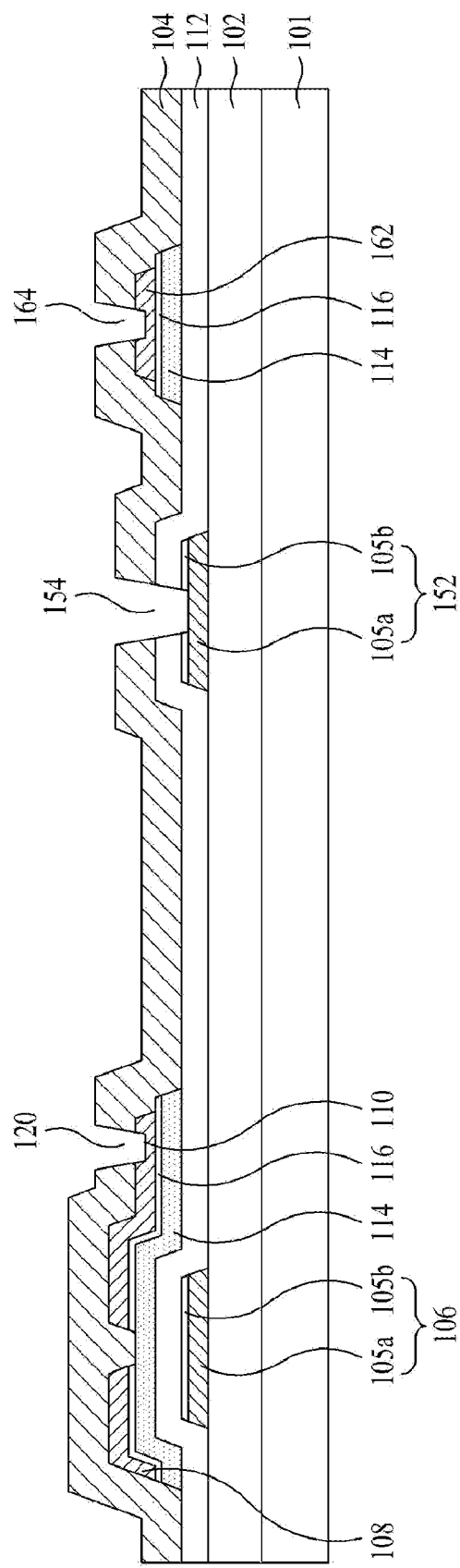

In reference to FIG. 3c, the protection film 104 including a first gate contact hole 154, a first data contact hole 164 and a first pixel contact hole 120 is formed on the substrate 101 having the second conductive pattern group formed thereon.

Specifically, the protection film 104 is formed on the gate dielectric film 112 having the second conductive pattern group formed thereon by using CVD, PECVD and the like. The protection film 104 is formed of inorganic dielectric material such as Silicon Oxide (SiOx) and Silicon Nitride (SiNx) or organic dielectric material such as acryl resin.

Hence, a photolithography and etching process using a third mask pattern the protection film 104 to form the first gate contact hole 154, first data contact hole 164 and first pixel contact hole 120. here, the first pixel contact hole 120 passes through the protection film 104 only to expose the drain electrode 110 of the driving thin film transistor T2 and the firs gate contact hole 154 passes through the protection film 104 and the gate dielectric film 112 only to expose the gate pad bottom electrode 152. The first data contact hole 164 passes through the protection film 104 only to expose the data pad bottom electrode 162.

The etching process for formation of the firs gate contact hole 154, first data contact hole 164 and first pixel contact hole 120 may remove predetermined regions of the drain electrode 110, data pad bottom electrode 162 and second gate metal layer 105b of the gate pad bottom electrode 152 may formed of molybdenum.

Figure 3D:
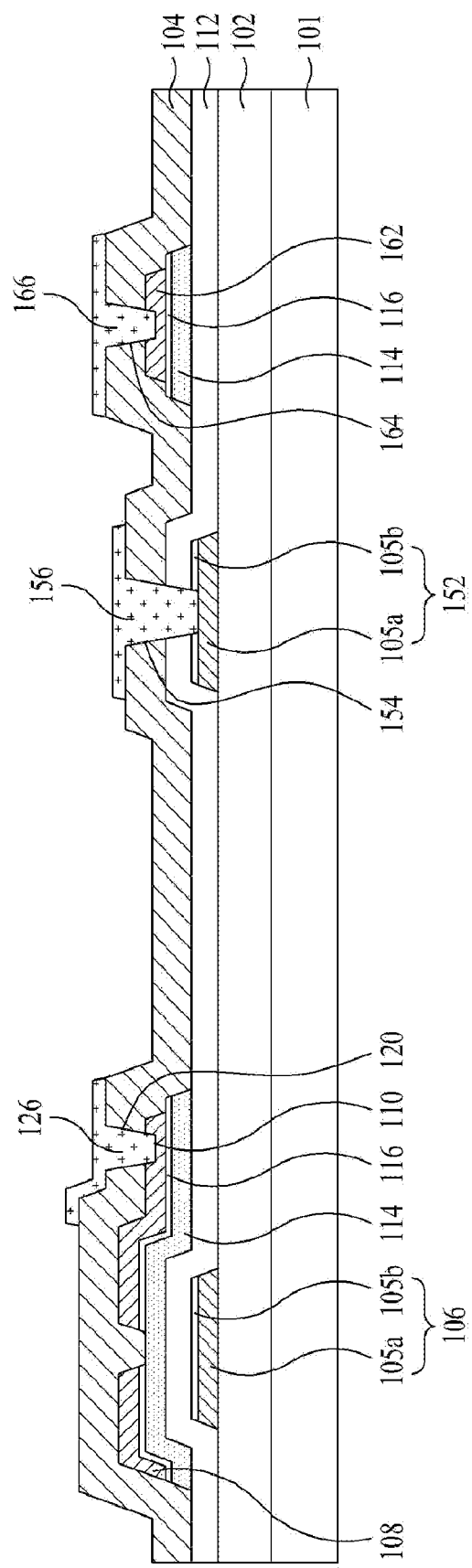

In reference to FIG. 3D, a third conductive pattern group including the contact electrode 126, gate top electrode 156 and data top electrode 166 is formed on the substrate 101 having the protection film 104 formed thereon.

Specifically, the contact conductive layer is formed on the substrate 101 having the protection film 104 formed thereon in a deposition method such as sputtering. Molybdenum-Titanium (MoTi) or Molybdenum-Tantalum (MoTa) is used to form the contact conductive layer.

Next, the contact conductive layer is pattered in a photolithography process and etching process using a fourth mask and the third conductive pattern group including the contact electrode 126, gate top electrode 156 and data top electrode 166 is formed.

Figure 3E:
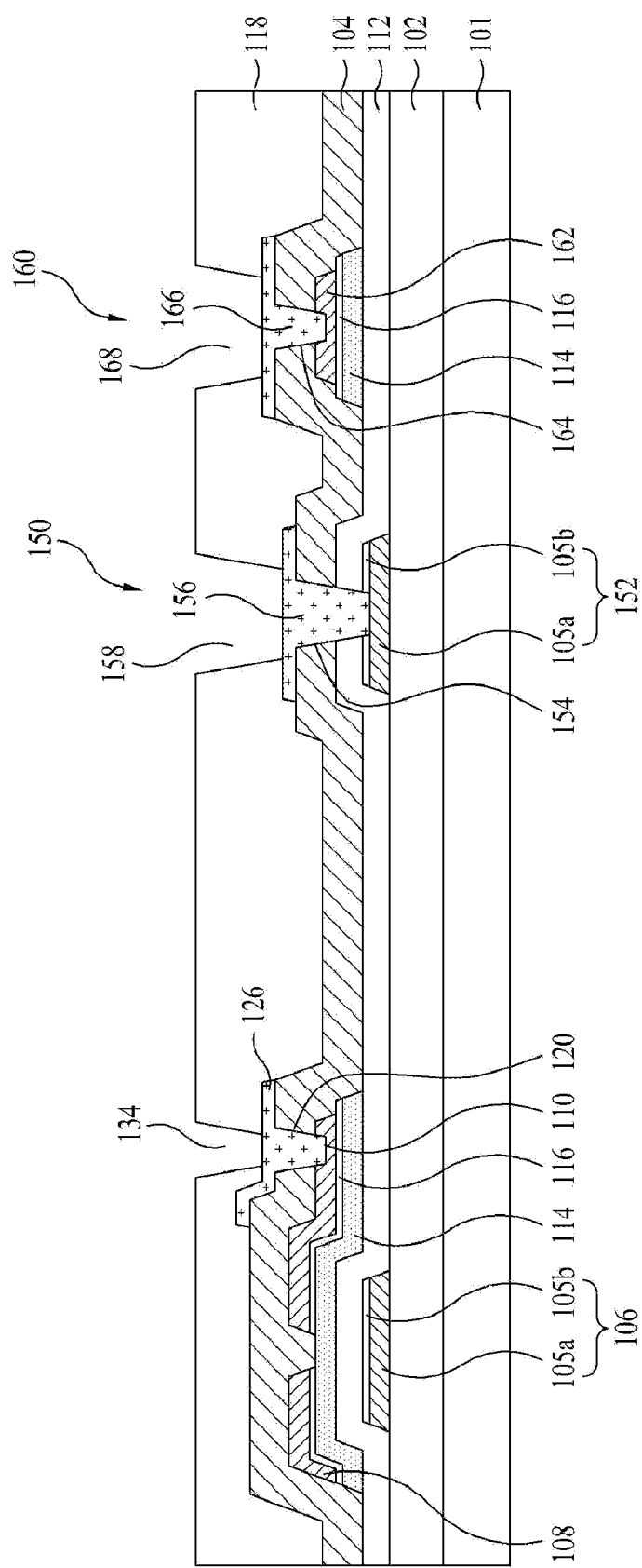

In reference to FIG. 3E, the planarization layer 118 including the second gate contact hole 158, a second data contact hole 168 and a second pixel contact hole 134 is formed on the substrate 101 having the third conductive pattern group formed thereon.

Specifically, the planarization layer 118 is formed on the protection film 104 having the third conductive pattern group formed thereon in a spin-coating or spinless-coating method. The planarization layer 118 is formed of organic dielectric material such as acrylic resin and polyimide (PI).

Next, the planarization layer 118 is patterned in a photolithography process and etching process using a fifth mask to form the second gate contact hole 158, second data contact hole 168 and second pixel contact hole 134. here, the second pixel contact hole 134 passes through the planarization layer 118 to expose the contact electrode 126 and the second gate contact hole 158 passes through the planarization layer 118 to expose the gate pad top electrode 156 and the second data contact hole 168 passes through the planarization layer 118 to expose the data pad top electrode 166.

Figure 3F:
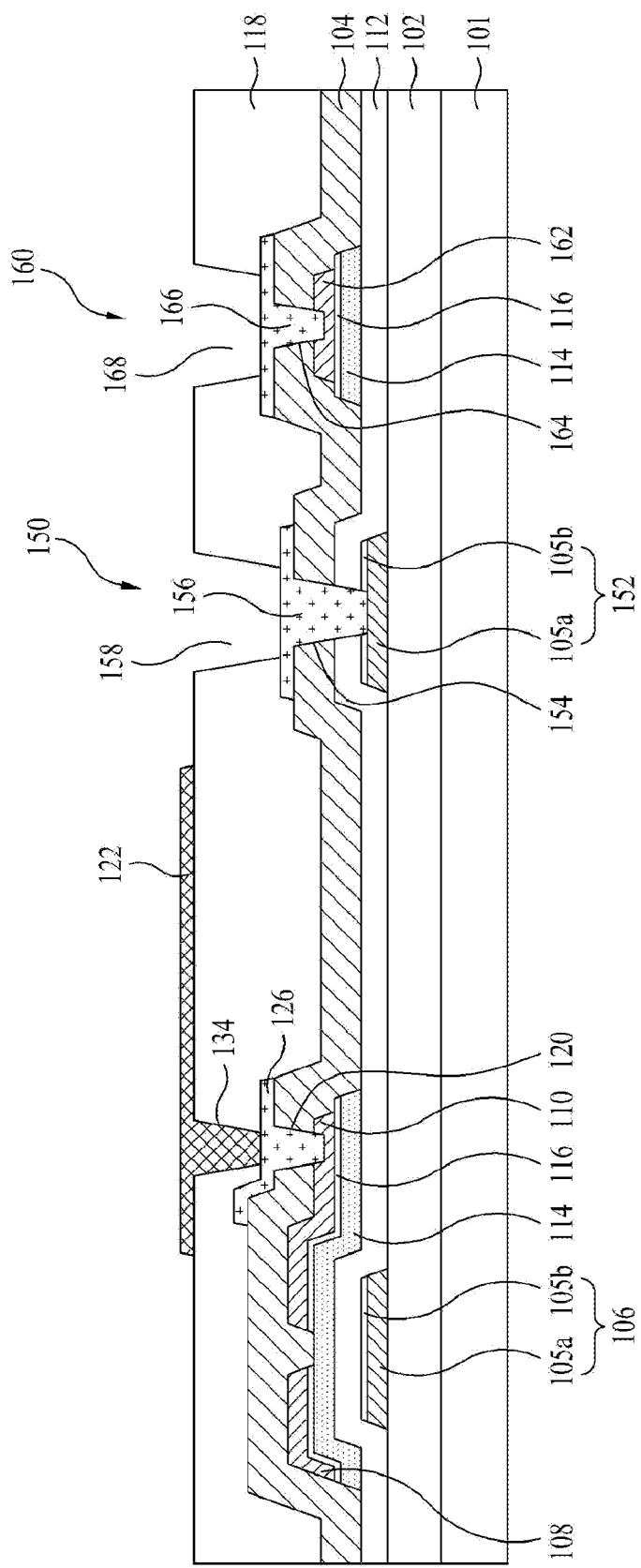

In reference to FIG. 3F, the cathode electrode 122 is formed on the substrate 101 having the planarization layer 118 formed thereon.

Specifically, after opaque conductive material such as Aluminum (Al) and Aluminum Neodymium (AlNd) is deposited on the planarization layer 118 in the deposition method such as sputtering, the planarization layer 118 is patterned in the photolithography process and etching process using the fifth mask to form the cathode electrode 122. The cathode electrode 122 is electrically connected with the drain electrode 110 via the first and second pixel contact holes 120 and 134 and the contact electrode 126.

Figure 3G:
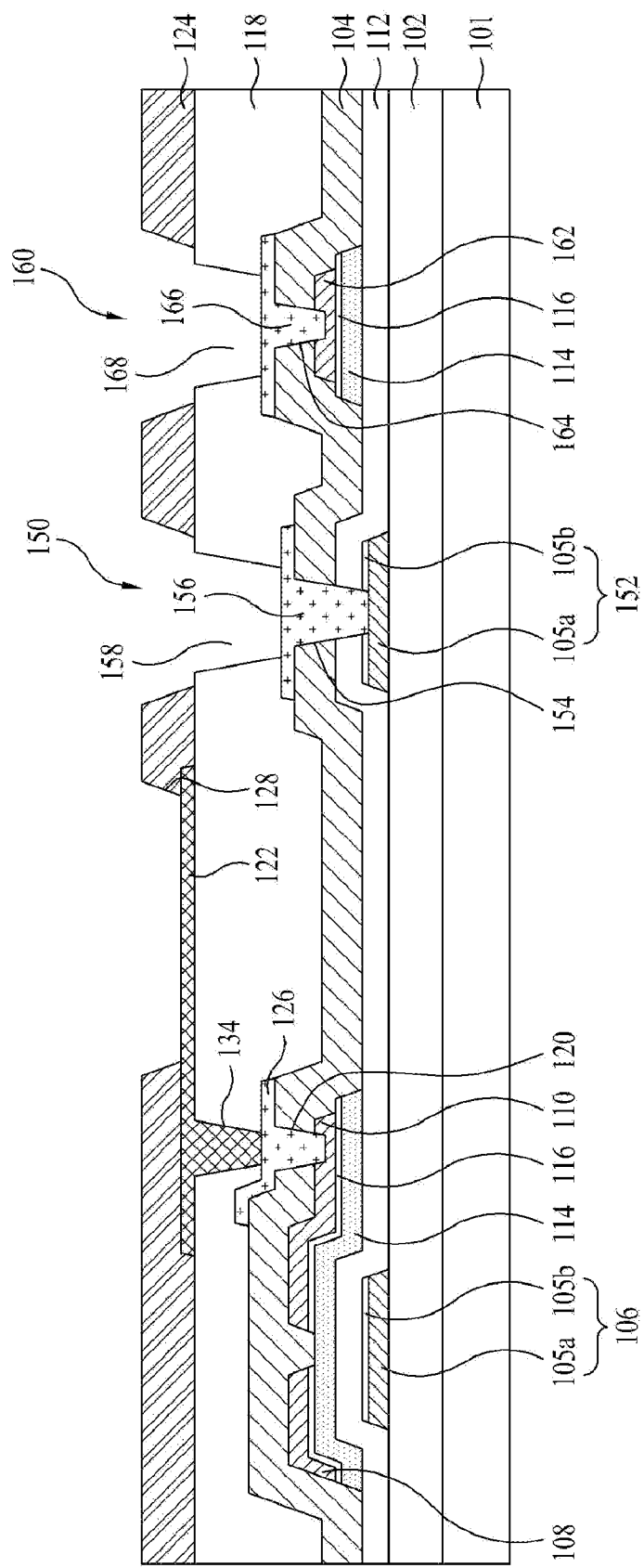

In reference to FIG. 3G, the bank dielectric film 124 including the pixel hole 128 is formed on the substrate 101 having the cathode electrode 122 formed thereon.

Specifically, photosensitive organic dielectric material or polyimide (PI) is coated on the substrate 101 having the cathode electrode 122 formed thereon in the spin-coating or spinless coating only to form the bank dielectric film 124. Such the bank dielectric film 124 is patterned in the photolithography process and etching process using a sixth mask and the pixel hole 128 for exposing the cathode electrode 122 is formed.

Figure 3H:
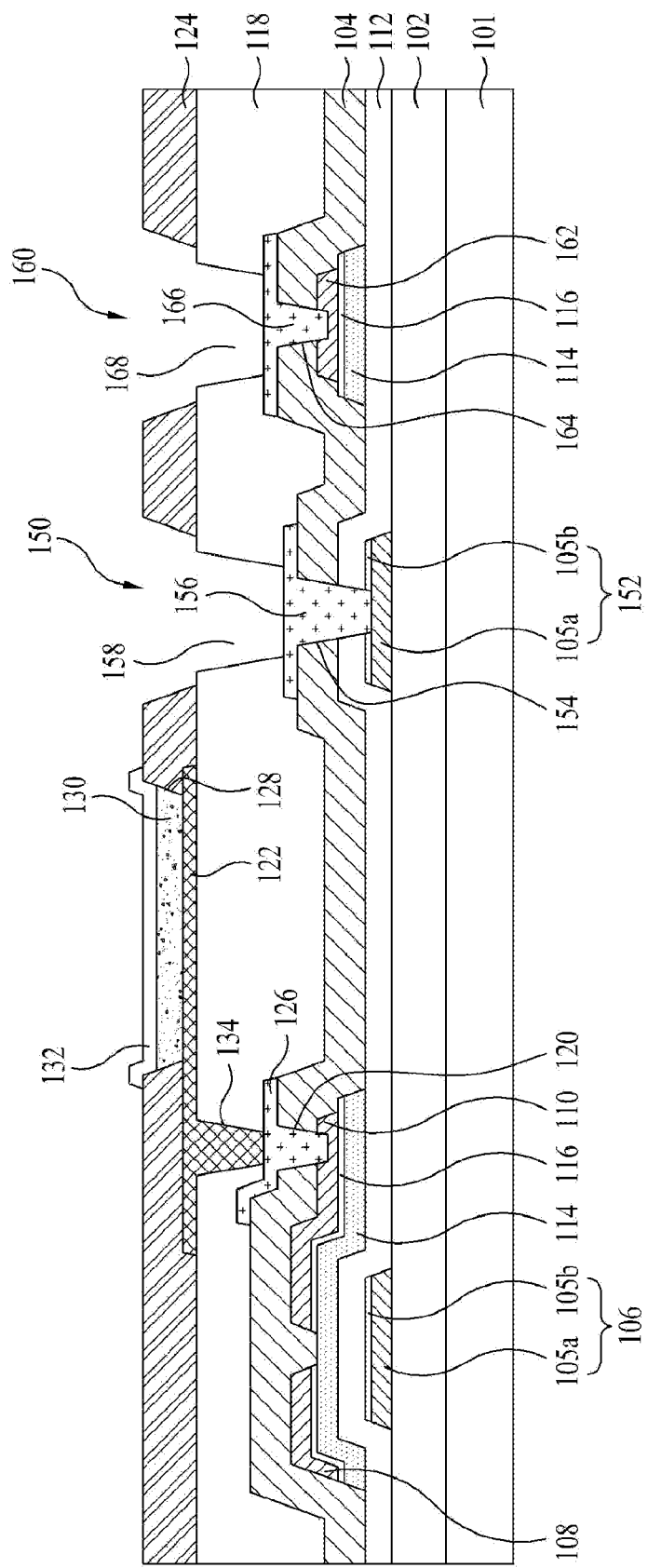

In reference to FIG. 3H, the organic layer 130 and anode electrode 132 are sequentially formed on the substrate 101 where the bank dielectric including the pixel hole 128 is formed.

Specifically, the organic layer 130 including the electrode injection layer, electrode transportation layer, light-emitting layer, hole transportation layer and hole injection layer is formed on the cathode electrode 122 exposed via the pixel hole 128 in a thermal deposition process, sputtering process or combinational process of the thermal deposition and sputtering. After that, a transparent conductive film is coated on the substrate 101 having the organic layer 130 formed thereon to form the anode electrode 132. Indium Tin Oxide (ITO), Tin Oxide (TO), Indium Zinc Oxide (IZO), $SnO_2$, Amorphous-Idium TO (a-TO) and the like may be used to form the transparent conductive film.

In the meanwhile, a sealing cap is formed on the substrate 101 having the anode electrode 132 formed thereon to protect the organic layer 130 from Oxygen or moisture. At this time, a glass cap or thin film cap layered with inorganic and organic films alternatively is used as the sealing cap.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic electroluminescent display device comprising:
    at least one switching transistor and driving transistor formed on a array substrate, wherein the array substrate includes a gate pad and a date pad formed thereon;
    a passivation layer having a plurality of a first contact holes to expose a portion of a drain electrode of the driving transistor, a gate pad bottom electrode of the gate pad and a date pad bottom electrode of the data pad respectively;
    a contact electrode, a gate pad top electrode of the gate pad and a data pad top electrode of the data pad formed on the passivation layer, the contact electrode, a top gate pad electrode and a top data pad electrode electrically connected to the exposed portion of the drain electrode of the driving transistor, the gate pad bottom electrode and the date pad bottom electrode respectively,
    a planarization layer formed on the passivation layer, the planarization layer including a plurality of a second contact holes to expose a portion of the contact electrode, the gate pad top electrode and the data pad top electrode respectively;
    a light-emitting cell including a cathode electrode, an anode electrode and an organic layer interposed therebetween formed on the planarization layer; wherein the cathode electrode is electrically connected to the contact electrode via one of the contact hole;
    wherein the contact electrode has acid-resistance with respect to an etchant used in patterning the cathode electrode.

2. The organic electroluminescent display device of claim 1, wherein the cathode electrode has a single layer structure formed of Aluminum-Neodymium and the top of at least one of the gate pad and data pad has a single layer structure formed of Molybdenum-Titanium.

3. The organic electroluminescent display device of claim 2, wherein the gate pad comprises:
the gate pad bottom electrode connected with a gate line; and the gate pad top electrode having the single layer structure formed of Molybdenum-Titanium, and the data pad comprises:
the data pad bottom electrode connected with a data line; and the data pad top electrode having the single layer structure formed of Molybdenum-Titanium.

4. The organic electroluminescent display device of claim 3, wherein the contact electrode is formed of a same metal and on a same layer to the gate pad top electrode and the data pad top electrode.

* * * * *